United States Patent [19]
Ringer, Jr.

[11] Patent Number: 4,590,094
[45] Date of Patent: May 20, 1986

[54] INVERTED APPLY USING BUBBLE DISPENSE

[75] Inventor: Frederick C. Ringer, Jr., Essex Junction, Vt.

[73] Assignee: International Business Machines Corporation, Armonk, N.Y.

[21] Appl. No.: 665,427

[22] Filed: Oct. 29, 1984

[51] Int. Cl.⁴ ............................................. B05D 5/12
[52] U.S. Cl. ..................................... 427/82; 118/50; 118/52; 118/54; 118/56; 427/240; 430/935
[58] Field of Search .................... 427/82, 240; 118/50, 118/52, 54, 56; 430/DIG. 935

[56] References Cited

U.S. PATENT DOCUMENTS

| 3,359,132 | 12/1967 | Wittman | 118/54 |
| 3,695,911 | 10/1972 | Polin | 117/34 |
| 4,267,208 | 5/1981 | Ireland | 427/154 |
| 4,378,953 | 4/1983 | Winn | 350/171 |
| 4,451,507 | 5/1984 | Beltz et al. | 427/240 |
| 4,476,162 | 10/1984 | Ireland | 427/240 |

OTHER PUBLICATIONS

IBM Technical Disclosure Bulletin, vol. 17, #11, Apr. 1975, pp. 3211-3212, "Use of Venturi to Accomplish Resist Splatter Dispersal".
Thickness Variance of Spun-On Photoresist, Revisted", Proceeding of the Kodak Microelectronics Seminar 1978, by J. W. Daughton et al.

Primary Examiner—John D. Smith
Assistant Examiner—Janyce A. Bell
Attorney, Agent, or Firm—Francis J. Thornton

[57] ABSTRACT

The invention described avoids all the problems of the above described prior art techniques and is characterized by holding the workpiece in an inverted position, contacting the inverted face of the workpiece with a precisely metered amount of a flowable material and rotating the workpiece in its inverted position after it has contacted the polymer to coat the workpiece with a thin, uniform layer of the flowable material. The present invention is also directed to an apparatus for coating a substrate comprising, a spindle holding the workpiece in an inverted manner so that the face of the workpiece to be coated faces downwardly towards a liquid deposit of the coating material which is supported on a nozzle beneath the spindle, which spindle may be moved to permit the inverted slice to contact the liquid deposit and means for spinning the spindle in the inverted position to spread the coating material uniformly across the face of the spinning workpiece.

7 Claims, 5 Drawing Figures 4,590,094

INVERTED APPLY USING BUBBLE DISPENSE

FIELD OF THE INVENTION

This invention relates generally to methods of coating bodies with thin protective films and more particularly to methods for applying thin uniform coatings of a flowable material on the face of the workpiece. More specifically, in accordance with the present invention the workpiece is inverted so that the face to be coated is facing downwardly and is brought into contact with a deposit of the material to be flowed on the surface. After contact the workpiece is rotated rapidly to provide a layer of material over the entire face of the workpiece.

BACKGROUND OF THE INVENTION

The art of dispensing liquids onto a rotatable substrate to form useful coatings is well known.

U.S. Pat. No. 3,695,911 teaches both a method and an apparatus for applying materials such as photoresist onto the surface of a spinning slice of semiconductor material.

U.S. Pat. No. 4,267,208 teaches the coating of a lens which is dipped into a pool of a vinyl copolymer, withdrawn from the pool, and spun to provide a uniform protective coating thereon.

U.S. Pat. No. 4,378,953 teaches the formation of a thin membrane by dispensing a polymer onto a spinning substrate to form a layer of the polymer on the substrate.

U.S. Pat. No. 4,451,507 teaches that a uniformly thick layer of a slurry of glass can be formed on the surface of a semiconductor material by rotating the semiconductor material as the glass slurry is dispensed thereon as a spiral bead.

IBM Technical Disclosure Bulletin, Vol. 17, #11, April 1975 on pages 3211–3212 discloses a typical photoresist dispensing apparatus presently in use in the Semiconductor Industry.

An article entitled, "Thickness Variance of Spun-On Photoresist, Revisited" appeared in the Proceedings of the Kodak Microelectronics Seminar, 1978, and teaches that thin layers of photoresist material may be spun on silicon slices.

Liquid photoresists are, today, applied to semiconductor wafers from the top as shown in the IBM Technical Disclosure Bulletin, Vol. 17, #11, April 1975, pages, 3211–3212.

This method causes a puddle of photoresist to be dripped onto the face of the wafer being coated, after which the wafer is spun at a high rotational speed. The centrifugal forces of the spinning overcomes the surface tension of the puddle of photoresist and results in a thin film of photoresist on the surface of the wafer.

This technique although widely and commonly used has several drawbacks. For example:

When levels of topography increases, the actual film thickness of the coating increases because of the effects of surface tension, gravity, substrate material properties, viscosity, spin speed, temperature, and etc. Moreover contaminants on the surface such as dust particles and the like can become trapped in pockets, trenches or the like.

Also, to avoid voids, pinholes, and assure coverage, excess amounts are puddled on the surface to be coated. Of the amount so puddled about 99% is spun off and thus wasted. For example, on a four inch wafer 1.5 to 2.0 ml of photoresist is usually used. This amount if allowed to remain on the surface would produce a uniform depth of at least 0.007 inches. In actual fact after spinning an average depth of 0.00005 inches remains. Thus at least 140 times more photoresist is puddled on the wafer than is actually needed to coat the wafer to the desired thickness. All of this excess photoresist is lost. Since photoresist costs about $600.00 per pint one can readily see that a large part of this cost is lost.

Still further there is the problem of backside contamination where unwanted photoresist is deposited on the wafer on its reverse face. This photoresist may be deposited on the back of the wafer where it is not wanted because of air turbulence, back splatter from the walls of the surrounding bowl or from extra drips that fall on the wafer holding chuck. This backside contamination can cause serious focusing problems in photolithographic tools.

SUMMARY OF THE INVENTION

The invention described avoids all the problems of the above described prior art techniques and is characterized by holding the workpiece in an inverted position, contacting the inverted face of the workpiece with a precisely metered amount of a flowable material and rotating the workpiece in its inverted position after it has contacted the polymer to coat the workpiece with a thin, uniform layer of the flowable material. The present invention is also directed to an apparatus for coating a substrate comprising, a spindle holding the workpiece in an inverted manner so that the face of the workpiece to be coated faces downwardly towards a liquid deposit of the coating material which is supported on a nozzle beneath the spindle, which spindle may be moved to permit the inverted slice to contact the liquid deposit and means for spinning the spindle in the inverted position to spread the coating material uniformly across the face of the spinning workpiece.

Because it is performed in an inverted position, the present invention not only provides a more uniform layer of coating material on the face of the workpiece regardless of the topography of the face of the workpiece but also does so with a significantly less amount of coating material required while eliminating deposition of any of the coating material on the back surface of the workpiece. Thus, the combination of gravity, centrifugal force, and surface tension all co-act to cause the photoresist to maintain a more uniform thickness across the slice regardless of the topographical features of the slice. Additionally, a significant savings in coating material is realized because smaller, more controlled amounts can be deposited on the slice to achieve a specified thickness.

These and other advantages and features of the present invention can be better appreciated from the following description of the invention taken in conjunction with the following drawings.

DETAILED DESCRIPTION OF THE PRESENT INVENTION

Figure 1:
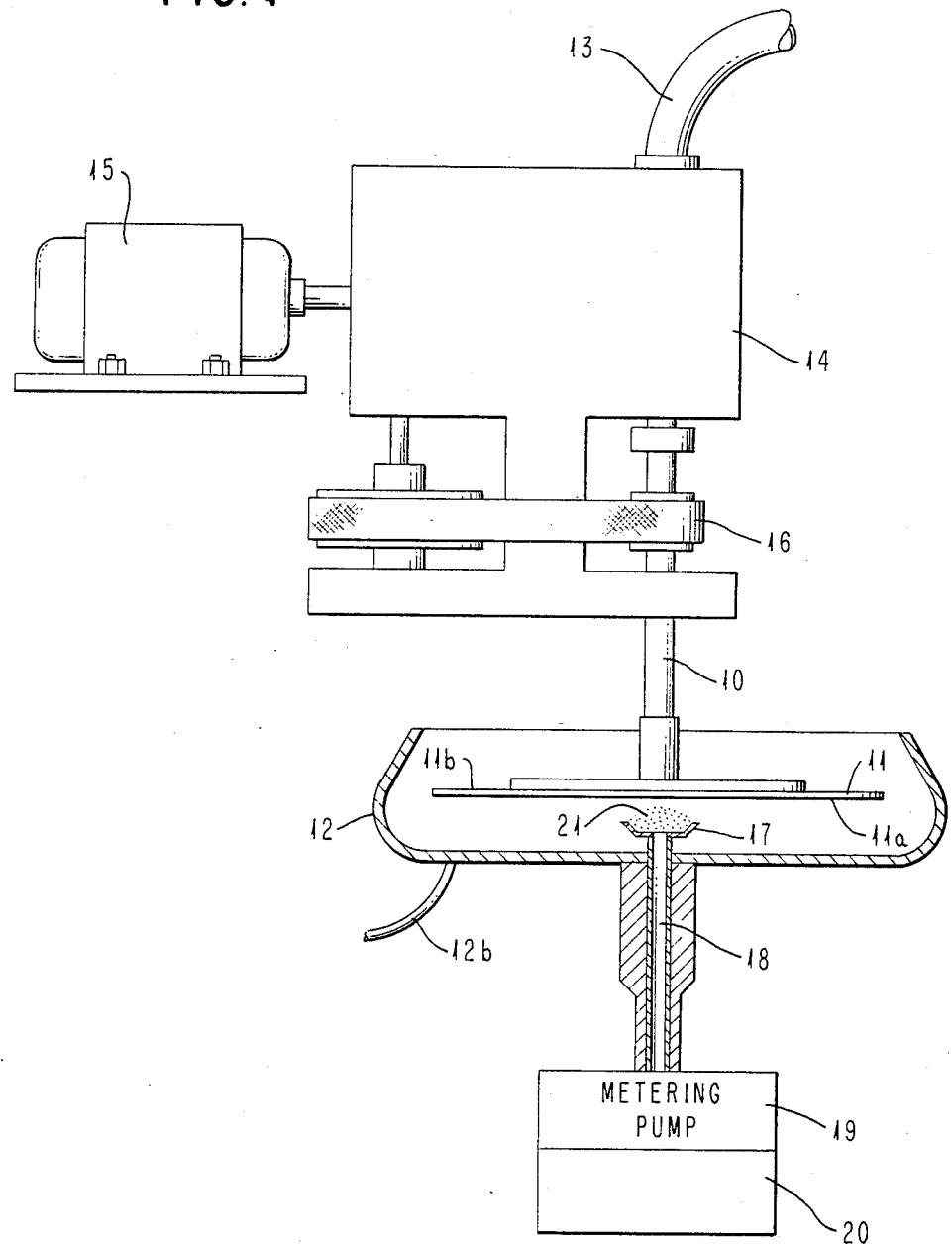
FIG. 1 is a schematic drawing of the invention showing a workpiece being held by the apparatus and positioned over a precisely metered bead of coating material to be applied on the inverted face of the workpiece.

Shown in FIG. 1, in schematic form, is the preferred embodiment of the invention which applies a selected substance onto one face of a workpiece.

In this embodiment there is illustrated an apparatus which includes a vacuum chuck or wafer pedestal 10 for holding a workpiece 11, such as semiconductor wafer or slice, in an inverted position. This wafer 11 has one face 11a which is to be coated, for example with photoresist, and has its outer face 11b supported on the flat face of the vacuum chuck 10. The shaft of chuck 10 is hollow and is adapted to be connected via a hollow tubing 13 to a suitable source of vacuum (not shown) to hold the wafer 11 on the face of the chuck. It should be understood that any suitable holding technique may be employed. The chuck 10 is driven through a transmission system 14 coupled to a motor 15. The transmission system 14 is adapted to raise and lower the chuck 10 as well as, through a belt drive mechanism 16, spin the chuck 10 and wafer 11 held thereon.

The chuck 10 and wafer 11 held thereon is positioned directly over a nozzle in the form of a cup 17 which is coupled through a hollow pedestal 18 to a pump 19 and a source 20 of coating material. In this example the coating material is photoresist. Pump 19 is a metering pump that dispenses an exact amount of photoresist 21 into the cup 17. By disposing a metered amount of photoresist 21 into the cup 17 and using an inverted wafer, as shown, not only is a less than normal amount of photoresist required to uniformly coat the surface 11a of the semiconductor wafer 11 but also other advantages, as will be discussed below, are realized.

Figure 2:
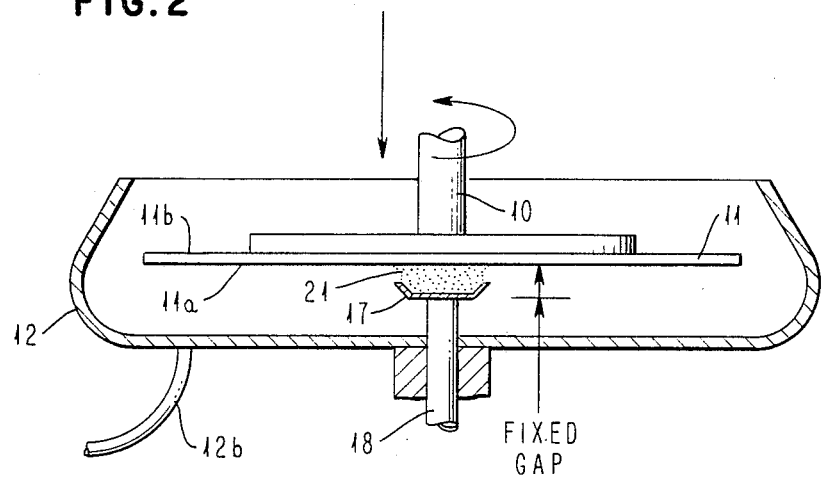
FIG. 2 is a fragmentary view of the present invention showing the workpiece in contact with the bead of coating material.
Figure 3:
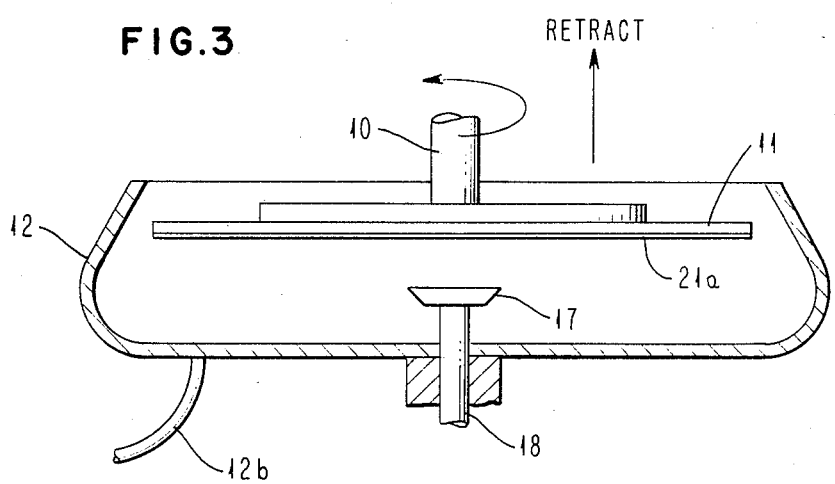
FIG. 3 is a fragmentary view of the present invention showing the workpiece coated with the coating material.

In a typical cycle of operation, the operator places the semiconductor wafer 11 onto the surface of the chuck 10, turns on the vacuum source to secure the wafer onto the chuck and causes the precise, selected amount of photoresist material to be dispensed into the cup 17 and form a meniscus 21 extending above the edge of the bowl 17. Thereafter, as shown in FIG. 2, the vacuum chuck 10 together with the wafer 11 held thereon is brought down, i.e. lowered into the interior of a shroud or bowl 12 and the surface 11a of the wafer is brought into contact with the meniscus formed by the photoresist 21 sited in the cup 17. When the wafer 11 comes in contact with the meniscus of the photoresist material 21, the material wets the surface 11a of the wafer 11. Once this contact has been made the belt drive system 16 is activated to cause the chuck 10 to rotate at a selected slow speed, say about 500 rpm. As the chuck 10 rotates centrifugal forces spreads the photoresist material 21 across the surface 11a. As the material spreads across the surface 11a internal cohesion forces in the photoresist causing the photoresist to be transferred out of the cup 17 and across the entire inverted surface 11a of the wafer 11. While continuing to rotate the chuck 10 and the wafer 11 is raised back to its original position where it is spun at a higher speed, say about 5,000 rpm. This insures a more uniform coating. As the wafer 11 spins excess photoresist material is thrown off the edges of the wafer onto the walls of the shroud or bowl 12 surrounding the spinning wafer. By making the walls of the shroud with a re-enterent form extending around the entire rim of the shroud 12 the spin off excess is caught. The shroud 12 is provided with an outlet drain 12b through which the excess photoresist may be drained.

It should be noted that these speeds can vary. For example, the initial starting, i.e. the flow speed can be from 0 to 1,000 rpm and the higher speed can be up to 16,000 rpm.

In specific tests high contact resist was used to coat silicon semiconductor wafers. The test data showed that average thicknesses of photoresist deposited over the face 11a of the wafer ranged from 11,000 to 16,000 Angstroms ±250 Angstroms depending upon wafer speeds and rotational speeds of the apparatus at the time the material was being deposited. Additionally, variation of the deposited photoresist, i.e. waves or undulations in the photoresist, deposited on the wafer was found to be equal to or less than 200 Angstroms.

The diameter of cup 17 as well as the properties of the coating materials determines the volume required to be dispensed and the shape and height of the meniscus formed. In specific tests a 0.625 inch diameter nozzle with a high contrast resist formed a 0.12 inch high bead which contains approximately 0.5 ml of resist.

As noted previously the prior art apparatus required a photoresist deposit of 1.5 to 2.0 milliters. In the present invention it was found less than one-third of that amount, i.e. 0.5 milliters or less could be used to achieve the same result. For example, when 100 mm wafers were coated using the prior art apparatus 2.0 ml of high contact photoresist was required when the wafers spun first at 1,000 rpm and then at 5,000 rpm to provide an average thickness of 11,033 Å and an average thickness variation of 211 Å.

When identical wafers were coated in the present apparatus only 0.5 ml of high contact photoresist was required to achieve an average coating thickness of 10,355 Å and an average thickness variation of 71 Å.

This significant reduction in quantities of photoresist required to be dispensed results in significant cost savings while the reduction in average thickness variation results in a 65% better control of the line widths that can be formed and developed in the photoresist thus leading to significant density improvements in the device that can be defined in the photoresist coating. Additionally it was found that with inverted spinning no problems were encountered with resist getting on the backside of the wafer and no further processing or special equipment was required to eliminate any contamination of the backside of the wafer with photoresist.

Additionally, it was found that the method coated equally as well as any known prior art technique and voids and pinholes are not encountered even though significantly smaller amounts of photoresist were used. As is best demonstrated in FIG. 2, the wafer 10 has deposited thereon a relatively substantially uniform layer of photoresist 21a which is equally disposed across the entire surface of the wafer. Additionally it has been found that the photoresist 21 provides uniform coverage of the wafer regardless of the topographical features that may have been previously created on the wafer.

Figure 4:
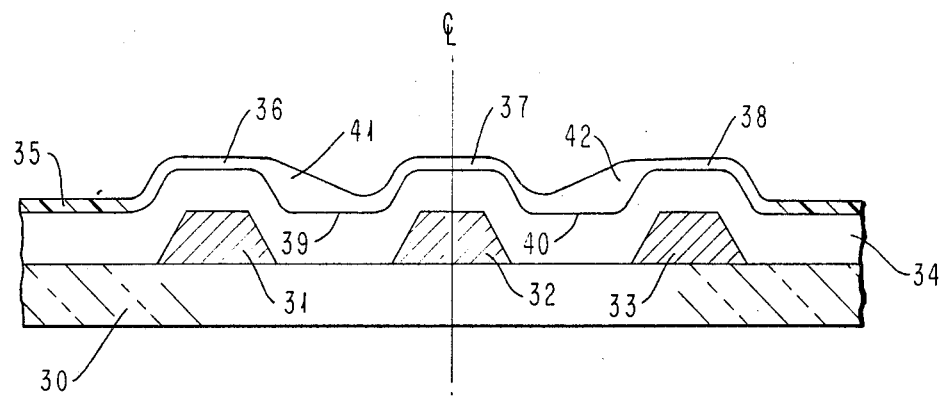
FIG. 4 is a cross-sectional view of a semiconductor slice coated using the prior art techniques and apparatus.
Figure 5:
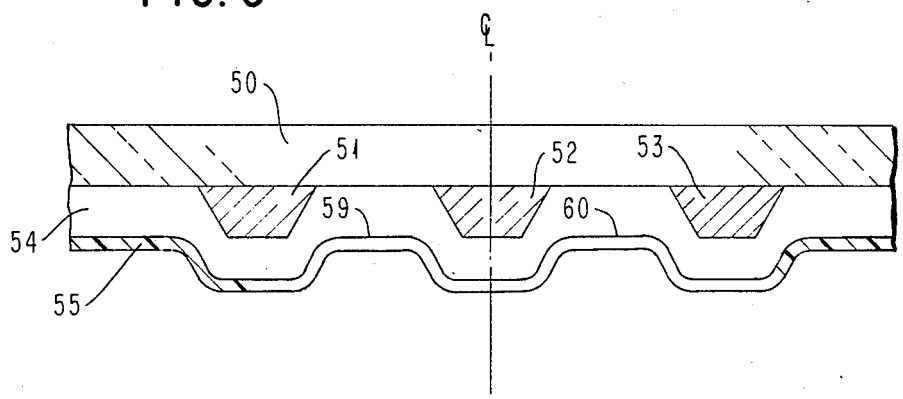
FIG. 5 is a cross-sectional view of a semiconductor slice coated using the techniques and apparatus of the present invention.

This can be more fully appreciated from FIGS. 4 and 5.

FIG. 4, shows, in cross section, a partial view of series of parallel lines 31, 32, and 33 and a number of crossing lines of which only one 34 is shown. For ease of explanation it will be assumed that the center line of the wafer is, as shown, passing vertically through line 32.

When a photoresist coating 35 is deposited on this wafer from the top, in accordance with the prior art and spun around its center line the forces of gravity causes the photoresist to thin out in areas 36, 37, and 38 over the lines 31, 32, and 33 and to thicken in the valleys 37 and 40 formed between the parallel lines 33, 37, and 38. The centrifugal forces resulting from the spinning action also causes build-up of the photoresist 41 and 42 on the walls of each valley 39 and 40 furthest from the center line around which the wafer is spun. This thickening of the photoresist against the walls of the valleys as well as the thickening of the photoresist in the valleys themselves causes variation in line width and required exposure times.

In the present invention these effects are minimized because the force of gravity is now helping to prevent excess material from accumulating in the valleys.

This is shown in FIG. 5 where a semiconductor wafer 50 has there on a series of parallel lines 51, 52, and 53, crossed by a line 54 and coated in accordance with the present invention with a coating of photoresist 55. In this case, the forces of gravity are acting such that no accumulation occurs in the valleys 59 and 60 and the layer of photoresist 55 is of relatively constant thickness over the entire surface. Also the force of gravity acting with the centrifugal forces caused by the spinning helps eliminate build-up of the photoresist on the far slopes of the valleys and thickening of the photoresist does not occur.

Additionally, because of the inversion of the chuck 10 and the wafer 11, with the photoresist 21 is being applied from below the wafer, the problem of excess photoresist material leaking around the shaft 13 and into the bearings supporting the chuck 10 and into the transmission 14 is prevented thus eliminating a serious cleaning problem which is present in the prior art apparatus when the photoresist is deposited from on the top of the apparatus.

The present invention thus teaches a method of substantially eliminating any resist on the reverse or back surface 11b of the semiconductor and eliminates the necessity of cleaning the back surface 11b of the wafer 11 after the front surface of the wafer 11 has been coated.

Additionally the present invention minimizes the usage of and waste of resist and other expensive coating materials.

Still further more conformal and more uniform coatings are formed on the surface of the wafer being coated regardless of wafer topology. Finally, by reducing the amount of material required to be dispensed the expenses of coating a wafer is substantially reduced and density improvements are realized.

It should also be understood that various modifications can readily be made. For example, the spindle 10 could be held in a fixed verticle position and the pedestal 18 can be made extendable so that the shroud 12 is raised to surround the wafer 11 and the photoresist 21 in the bowl 17 is brought into contact with the force 11b of the wafer 11.

While the invention has been particularly shown and described with reference to a preferred embodiment thereof it will be understood by those skilled in the art that the foregoing and other changes in form and detail may be made therein without departing from the spirit and scope of the invention.

What is claimed is:

1. An apparatus for coating photoresist on a wafer comprising:
    a spindle holding the wafer with a vacuum force in an inverted position,
    means for providing a predetermined deposit of photoresist in a bowl beneath said spindle sufficient to cause the photoresist to extend above the edges of the bowl and to form a convex meniscus above the surface of the bowl
    said bowl having a diameter substantially smaller than the wafer,
    means for causing the inverted wafer to contact the meniscus of the deposit of photoresist in said bowl, and
    means for rotating the spindle in the inverted position in contact with said controlled amount of photoresist to spin the wafer and spread the photoresist across the spinning wafer.

2. A method of depositing photoresist on a semiconductor wafer comprising the steps of:
    supporting the wafer on a rotatable means in an inverted position and providing below the inverted wafer a preselected volume of photoresist having a diameter substantially smaller than the diameter of the wafer,
    moving the said inverted wafer into contact with said photoresist,
    rotating said wafer in said inverted position in contact with said volume of photoresist at a selected speed to spread substantially the entire preselected volume of the photoresist across the downwardly facing side of said spinning wafer,
    selectively increasing the rotational speed of the said spinning wafer above said selected speed, after said preselected volume of photoresist has been spread over the downwardly facing side of said spinning wafer, to cast off excess photoresist material and to thin out said photoresist to a selected average thickness,
    terminating the rotation of said wafer after a predetermined time.

3. The apparatus of claim 1 wherein said means for spinning the spindle includes a variable speed transmission and a motor.

4. The apparatus of claim 3 wherein there is further provided a shroud surrounding the wafer for catching excess photoresist material thrown off said spinning disk.

5. The apparatus of claim 4 wherein said shroud is provided with a wall having a re-enterent form, said wall extending up around said bowl and said spinning wafer.

6. The method of claim 2 wherein said wafer is initially rotated in a range of 500 to 1,000 rpm and increased up to 16,000 rpm.

7. The method of claim 6 wherein the rotation of said wafer is terminated after a time resulting in an average thickness of between 4,000 and 5,000 Angstroms.

* * * * *